(12) United States Patent
Zhang et al.

(10) Patent No.: US 12,545,988 B2
(45) Date of Patent: Feb. 10, 2026

(54) DISPLAY SUBSTRATE, METHOD AND DEVICE FOR MANUFACTURING DISPLAY SUBSTRATE, AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Yuanqi Zhang, Beijing (CN); Peng Xu, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 949 days.

(21) Appl. No.: 17/303,505

(22) Filed: Jun. 1, 2021

(65) Prior Publication Data

US 2021/0288297 A1  Sep. 16, 2021

Related U.S. Application Data

(62) Division of application No. 16/156,056, filed on Oct. 10, 2018, now Pat. No. 11,056,677.

(30) Foreign Application Priority Data

Jan. 30, 2018 (CN) .......................... 201810089790.3

(51) Int. Cl.
*C23C 14/04* (2006.01)
*H10K 71/16* (2023.01)
(Continued)

(52) U.S. Cl.
CPC ......... *C23C 14/042* (2013.01); *H10K 71/164* (2023.02); *H10K 71/166* (2023.02);
(Continued)

(58) Field of Classification Search
CPC .... C23C 14/042; C23C 14/24; H10K 71/164; H10K 71/166; H10K 71/60; H10K 59/00; H10K 71/851
(Continued)

(56) References Cited

U.S. PATENT DOCUMENTS 8,551,795 B2   10/2013   Lee et al.
2007/0009671 A1   1/2007   Manz
(Continued)

FOREIGN PATENT DOCUMENTS

CN   202139291 U  *  2/2012
CN   103866238 A     6/2014
(Continued)

OTHER PUBLICATIONS

English translation of CN 202139291 (Year: 2024).*
(Continued)

*Primary Examiner* — Aiden Lee
(74) *Attorney, Agent, or Firm* — BROOKS KUSHMAN P.C.

(57) ABSTRACT

A display substrate, a method and a device for manufacturing the display substrate, and a display device are provided. The method includes shielding a to-be-cut region of a to-be-evaporated substrate with a shielding member and evaporating a common layer material onto the to-be-evaporated substrate to form a common layer of the display substrate. The display substrate includes the to-be-cut region and a display region surrounding the to-be-cut region, and the common layer material is deposited onto the display region rather than the to-be-cut region.

5 Claims, 6 Drawing Sheets

(51) Int. Cl.
*H10K 71/60* (2023.01)
*C23C 14/24* (2006.01)
*H10K 71/00* (2023.01)

(52) U.S. Cl.
CPC ............. *H10K 71/60* (2023.02); *C23C 14/24* (2013.01); *H10K 71/851* (2023.02)

(58) Field of Classification Search
USPC ................................................ 118/720–721
See application file for complete search history.

(56) References Cited

U.S. PATENT DOCUMENTS

| | | | | |
|---|---|---|---|---|
| 2009/0291203 | A1* | 11/2009 | Hagi | ..................... C03C 17/002 427/126.3 |
| 2016/0355923 | A1 | 12/2016 | Mu et al. | |
| 2017/0090280 | A1* | 3/2017 | Fujino | ................... G03F 7/7035 |
| 2017/0342542 | A1* | 11/2017 | Ghosh | ................... C23C 14/042 |
| 2017/0342543 | A1* | 11/2017 | Ghosh | ................... C23C 14/042 |
| 2017/0343901 | A1 | 11/2017 | Ghosh et al. | |
| 2019/0051827 | A1 | 2/2019 | Yu | |
| 2020/0083453 | A1* | 3/2020 | Zang | ................. H01L 21/67736 |
| 2021/0020871 | A1* | 1/2021 | Wang | ....................... C23C 14/24 |
| 2021/0225900 | A1* | 7/2021 | Liu | ..................... H10D 86/0231 |

FOREIGN PATENT DOCUMENTS

| | | | |
|---|---|---|---|
| CN | 105154820 | A | 12/2015 |
| CN | 205954096 | U | 2/2017 |
| CN | 106884139 | A | 6/2017 |
| CN | 107236927 | A  * | 10/2017 ........... C23C 14/042 |
| CN | 107507915 | A | 12/2017 |
| JP | 2009122685 | A | 6/2009 |
| WO | 2018166634 | A1 | 9/2018 |

OTHER PUBLICATIONS

First Office Action for Chinese Application No. 201810089790.3, dated May 27, 2019, 8 Pages.
Non-Final Rejection for U.S. Appl. No. 16/156,056, dated Jun. 16, 2020, 19 Pages.

* cited by examiner

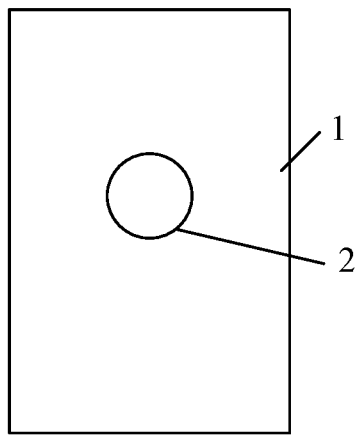

FIG. 1A

```
┌─────────────────────────────────────────────────┐
│ shielding a to-be-cut region of a to-be-evaporated substrate │
│ with a shielding member and evaporating a common layer      │──100
│ material onto the to-be-evaporated substrate to form a      │
│ common layer of a display substrate                          │
└─────────────────────────────────────────────────┘
```

FIG. 1B

```
┌─────────────────────────────────────────────────┐
│ placing a shielding member into an evaporation chamber to   │
│ enable the shielding member to be attached to the to-be-cut │──110
│ region after a to-be-evaporated substrate is placed into the│
│ evaporation chamber,                                         │
└─────────────────────────────────────────────────┘
                            ↓
┌─────────────────────────────────────────────────┐
│ placing a metal mask plate for manufacturing a common layer │──120
│ into the evaporation chamber, and aligning the metal mask plate │
│ with the to-be-evaporated substrate                          │
└─────────────────────────────────────────────────┘
                            ↓
┌─────────────────────────────────────────────────┐
│ evaporating a common layer material onto the to-be-evaporated │──130
│ substrate to form the common layer of a display substrate    │
└─────────────────────────────────────────────────┘
                            ↓
┌─────────────────────────────────────────────────┐
│ moving the metal mask plate out of the evaporation chamber  │──140
└─────────────────────────────────────────────────┘
                            ↓
┌─────────────────────────────────────────────────┐
│ moving the shielding member out of the evaporation chamber  │──150
└─────────────────────────────────────────────────┘
```

FIG. 1C

DISPLAY SUBSTRATE, METHOD AND DEVICE FOR MANUFACTURING DISPLAY SUBSTRATE, AND DISPLAY DEVICE

CROSS-REFERENCE TO RELATED APPLICATIONS

This application is a divisional of U.S. application Ser. No. 16/156,056, filed Oct. 10, 2018, which claims priority to Chinese Patent Application No. 201810089790.3 filed on Jan. 30, 2018, which are incorporated herein by reference in their entireties.

TECHNICAL FIELD

The present disclosure relates to the field of display technology, for example, to a display substrate, a method and a device for manufacturing the display substrate, and a display device.

BACKGROUND

With the rapid development of the display technology, display panels have been widely used in various fields, and more requirements have been raised on the design of the display panels. Usually, most of the market-available display panels are each an integral piece. The display panel may be combined with any other product to provide more functions or improve its appearance. For example, a timepiece may be embedded in the middle of the display panel, or a plurality of decorative patterns may be arranged on the display panel.

When the display panel is combined with the other product, a portion of the display panel is cut off.

SUMMARY

A method for manufacturing a display substrate includes shielding a to-be-cut region of a to-be-evaporated substrate with a shielding member and evaporating a common layer material onto the to-be-evaporated substrate to form a common layer of the display substrate. The display substrate includes the to-be-cut region and a display region surrounding the to-be-cut region, and the common layer material is deposited onto the display region rather than the to-be-cut region.

In some embodiments of the present disclosure, the shielding the to-be-cut region of the to-be-evaporated substrate with the shielding member and evaporating the common layer material onto the to-be-evaporated substrate to form the common layer of the display substrate includes:
  placing the shielding member into an evaporation chamber after placing the to-be-evaporated substrate into the evaporation chamber, and attaching the shielding member to the to-be-cut region;
  placing a metal mask plate used in the formation of the common layer into the evaporation chamber, and aligning the metal mask plate with the to-be-evaporated substrate; and
  evaporating the common layer material onto the to-be-evaporated substrate to form the common layer of the display substrate.

In some embodiments of the present disclosure, the shielding member is a magnetic member. The placing the shielding member into the evaporation chamber and attaching the shielding member to the to-be-cut region includes: placing a support plate carrying the shielding member into the evaporation chamber, and moving the support plate to enable the shielding member to be in contact with the to-be-cut region on a first surface of the to-be-evaporated substrate; enabling a first electromagnet at a side of a second surface of the to-be-evaporated substrate to attract the shielding member onto the first surface, where the first surface is opposite to the second surface and arranged towards an evaporation source; and moving the support plate out of the evaporation chamber.

In some embodiments of the present disclosure, the method further includes stretching the shielding member before placing the support plate carrying the shielding member into the evaporation chamber, where the support plate is provided with an alignment mark; placing the shielding member at a predetermined position on a support surface of the support plate through the alignment mark; and attaching the shielding member onto the support surface through a suction member, where the support surface is a surface of the support plate where the shielding member is placed.

In some embodiments of the present disclosure, the suction member is a second electromagnet arranged at a side of the support plate away from the support surface.

In some embodiments of the present disclosure, the method further includes de-energizing the second electromagnet after the enabling the shielding member to be in contact with the to-be-cut region on the first surface of the to-be-evaporated substrate and before the enabling the first electromagnet at a side of the second surface of the to-be-evaporated substrate to attract the shielding member onto the first surface.

In some embodiments of the present disclosure, the suction member is a vacuum chuck arranged on the support surface.

In some embodiments of the present disclosure, the method further includes, disenabling the vacuum chuck after the enabling the shielding member to be in contact with the to-be-cut region on the first surface of the to-be-evaporated substrate and before the enabling the first electromagnet at a side of the second surface of the to-be-evaporated substrate to attract the shielding member onto the first surface.

In some embodiments of the present disclosure, the method further includes: moving the metal mask plate out of the evaporation chamber after forming the common layer of the display substrate; and moving the shielding member out of the evaporation chamber.

In some embodiments of the present disclosure, the moving the shielding member out of the evaporation chamber includes: placing the support plate into the evaporation chamber and moving the support plate to make the support surface of the support plate to be in contact with the shielding member; de-energizing the first electromagnet; enabling the suction member to attach the shielding member onto the support plate; and moving the support plate carrying the shielding member out of the evaporation chamber.

In some embodiments of the present disclosure, the shielding member has a thickness not greater than a thickness of the metal mask plate.

In another aspect, the present disclosure provides in some embodiments a device for manufacturing a display substrate, including: an evaporation source configured to evaporate a common layer material for forming a common layer of the display substrate onto a to-be-evaporated substrate; a shielding member configured to shield a to-be-cut region of the to-be-evaporated substrate; and a moving mechanism configured to move the shielding member to shield the to-be-cut region when the common layer material is evaporated by the evaporation source onto the to-be-evaporated substrate.

In some embodiments of the present disclosure, the shielding member is a magnetic member, and the device further includes a support plate and a controller. The support plate is connected to the moving mechanism and configured to carry the shielding member. The support member includes a suction member. The controller is electrically connected to the suction member, and configured to control the suction member to attach the shielding member onto the support plate.

In some embodiments of the present disclosure, the device further includes an evaporation chamber and a first electromagnet, where the first electromagnet arranged within the evaporation chamber at a side of the to-be-evaporated substrate away from the evaporation source, and configured to attract the shielding member onto the to-be-evaporated substrate.

In some embodiments of the present disclosure, the suction member is a second electromagnet arranged at a side of the support plate away from a support surface which is a surface of the support plate where the shielding member is placed.

In some embodiments of the present disclosure, the suction member is a vacuum chuck arranged on a support surface of the support plate, and the support surface is a surface of the support plate where the shielding member is placed.

In some embodiments of the present disclosure, the device further includes a mechanical arm configured to stretch the shielding member, and place the shielding member at a predetermined position on a support surface of the support plate through an alignment mark on the support plate. The support surface is a surface of the support plate where the shielding member is placed.

In yet another aspect, the present disclosure further provides in some embodiments a display substrate manufactured through the above-mentioned method. A to-be-cut region of the display substrate does not cover a common layer.

In still yet another aspect, the present disclosure further provides in some embodiments a display device including the above-mentioned display substrate.

BRIEF DESCRIPTION OF THE DRAWINGS

FIG. 1A is a schematic view showing an internally-perforated display panel in the related art;

FIG. 1B is a flow chart of a method for manufacturing a display substrate according to some embodiments of the present disclosure;

FIG. 1C is a flow chart of the method for manufacturing the display substrate according to some other embodiments of the present disclosure;

DETAILED DESCRIPTION

Figure 1D:
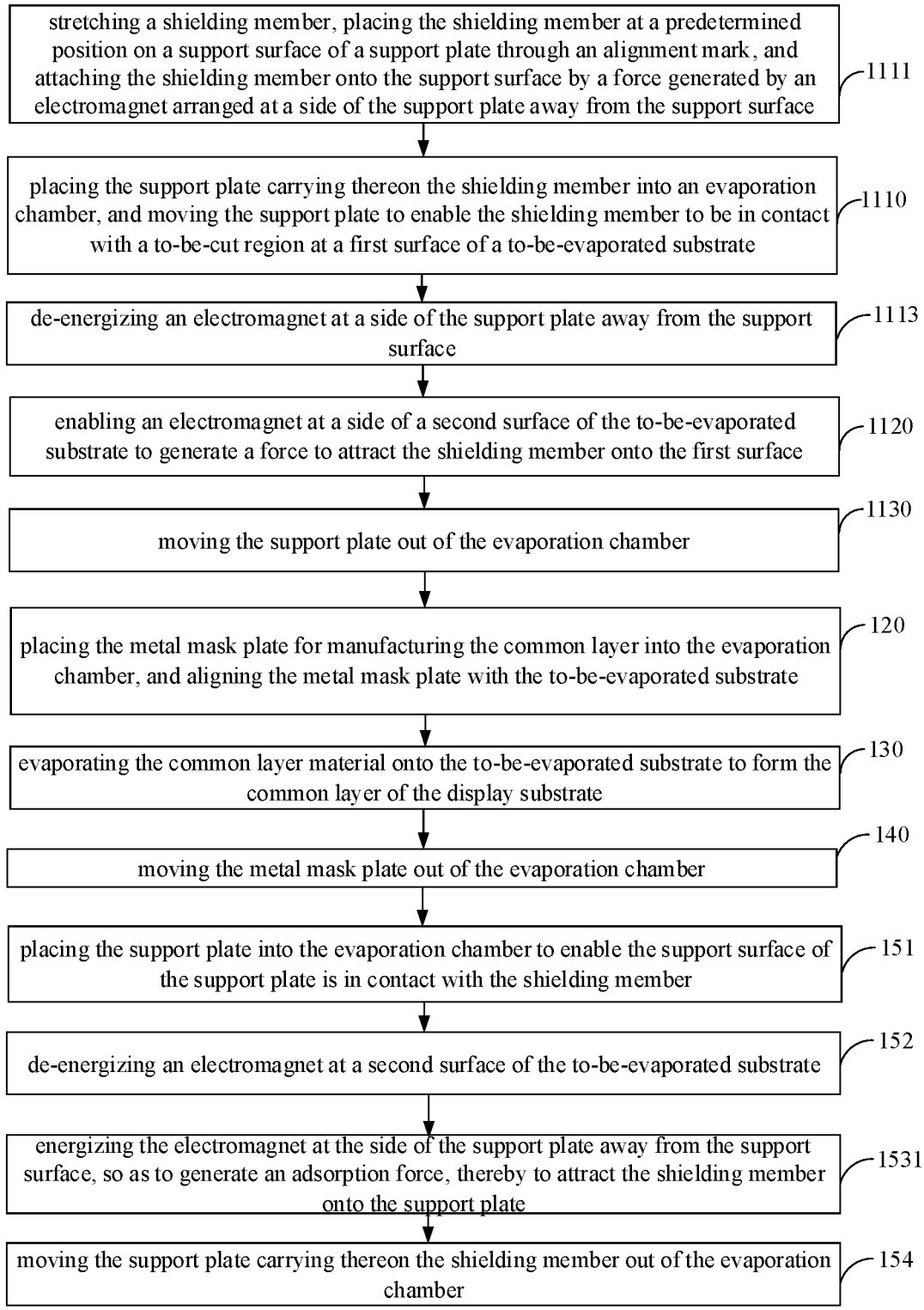
FIG. 1D is a flow chart of the method for manufacturing the display substrate according to some other embodiments of the present disclosure.

In the related art, an organic light-emitting diode (OLED) display substrate includes a thin film transistor (TFT) array, an anode, a pixel definition layer, a hole injection layer, a hole transport layer, an organic light-emitting layer, an electron transport layer, an electron injection layer and a cathode arranged sequentially on a base substrate. A common layer includes the hole injection layer, the hole transport layer, the electron transport layer and the electron injection layer. During a process of manufacturing the OLED display substrate, a common layer material (a material used to make of the common layer) is evaporated onto an entire surface of the base substrate.

As shown in FIG. 1A which is a schematic view showing an internally-perforated display panel 1 in the related art, the display panel 1 includes a display region and a to-be-cut region 2 surrounded by the display region.

During a process of manufacturing the internally-perforated display panel, a display substrate of the display panel is cut. At this time, a common layer of the display substrate is exposed to air at a cutting position. The moisture enters the display panel through the cutting position of the common layer, so a light-emitting element of the display panel may be destroyed, and a service life of a display device may be shortened.

The present disclosure provides a display substrate, a method and a device for manufacturing the display substrate, and a display device, which prolongs the service life of the display device.

As shown in FIG. 1B, the present disclosure provides in some embodiments a method for manufacturing a display substrate, which includes Step 100. In step 100, a to-be-cut region of a to-be-evaporated substrate is shielded with a shielding member, and a common layer material (material for manufacturing the common layer) is evaporated onto the to-be-evaporated substrate to form a common layer of the display substrate. The display substrate includes a display region where the common layer material is deposited and the to-be-cut region surrounded by the display region.

According to the embodiments of the present disclosure, when the common layer material is evaporated onto the to-be-evaporated substrate to form the common layer, the to-be-cut region of the display substrate is shielded with the shielding member, and the common layer does not cover the to-be-cut region. When the to-be-cut region not covered by the common layer is encapsulated and cut, it is able to prevent the common layer from being in contact with an external environment due to an encapsulation layer cover the edge of the common layer, and prevent the moisture and oxygen from entering the display substrate, thereby to prevent the service life of a resultant display device from being adversely affected.

For example, after the display substrate has been manufactured and encapsulated, the encapsulation layer rather than any for-display layer is formed at the to-be-cut region. At this time, when the to-be-cut region is cut, the common layer is not exposed at a cutting position, and the common layer is not in contact with the external environment due to the encapsulation layer.

In some embodiments of the present disclosure, as shown in FIG. 1C, the shielding the to-be-cut region of the to-be-evaporated substrate with the shielding member and evaporating the common layer material onto the to-be-evaporated substrate to form the common layer of the display substrate may include Step 110, Step 120 and Step 130. In Step 110, after the to-be-evaporated substrate has been placed into an evaporation chamber, the shielding member is placed into the evaporation chamber and attaches to the to-be-cut region. In Step 120, a metal mask plate for manufacturing the common layer is placed into the evaporation chamber, and is aligned with the to-be-evaporated substrate. In Step 130, the common layer material is evaporated onto the to-be-evaporated substrate to form the common layer of the display substrate. The common layer material is deposited onto the display region rather than the to-be-cut region.

Through shielding the to-be-cut region with the shielding member, it is able to prevent the common layer material from being evaporated onto a surface of the to-be-cut region. An edge of the display substrate is shielded by the metal mask plate.

In some embodiments of the present disclosure, the number of the shielding members is determined by the number of the to-be-cut regions, i.e., the number of the shielding members is the same as the number of the to-be-cut regions.

In some embodiments of the present disclosure, shielding member has the same size and the same shape as the to-be-cut region. For example, the shielding member is of a circular, elliptical, square or irregular shape.

In some embodiments of the present disclosure, the shielding member is made of a magnetic material.

Figure 1E:
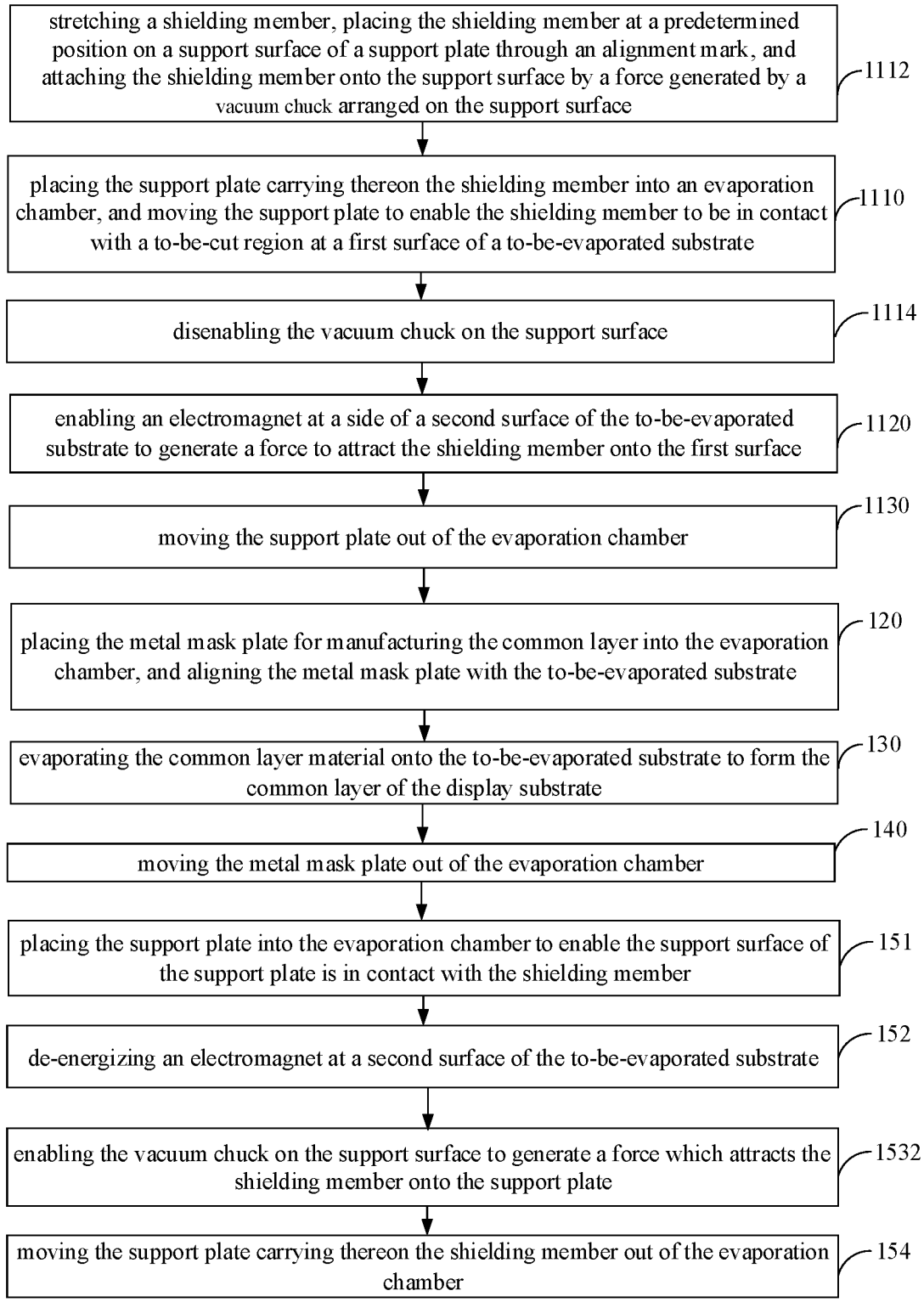
FIG. 1E is a flow chart of the method for manufacturing the display substrate according to some other embodiments of the present disclosure.

In some embodiments of the present disclosure, as shown in FIGS. 1D and 1E, Step 110 includes Step 1110, Step 1120 and Step 1130.

In Step 1110, a support plate carrying thereon the shielding member is placed into the evaporation chamber and moved to enable the shielding member to be in contact with the to-be-cut region on a first surface of the to-be-evaporated substrate.

In Step 1120, an electromagnet (i.e., a first electromagnet 61 as mentioned hereinafter) at a side of a second surface of the to-be-evaporated substrate is controlled to generate a force to attract the shielding member onto the first surface, where the first surface is opposite to the second surface and faces an evaporation source.

In Step 1130, the support plate is moved out of the evaporation chamber.

In some embodiments of the present disclosure, before evaporating the common layer material onto the to-be-evaporated substrate, an electromagnet is arranged at a side of the second surface of the to-be-evaporated substrate and configured to generate a force to attract the shielding member onto the to-be-cut region. During a process of evaporating the common layer material onto the to-be-evaporated substrate, the to-be-cut region is shielded by the shielding member.

The shielding member is of a relatively small thickness and easily folded, so in some embodiments, the shielding member is placed on the support plate and then moved into the evaporation chamber. And in some embodiments, the shielding member is stretched and then placed at a predetermined position of the support plate. When the shielding member has been stretched, it is able for a surface of the shielding member to remain flat.

In some embodiments of the present disclosure, the shielding member is attached onto the support plate by a force generated by a vacuum chuck arranged on the support plate or an electromagnet (i.e., a second electromagnet 62 mentioned hereinafter) arranged at a side of the support plate away from the support surface.

In some embodiments of the present disclosure, the support plate is provided with an alignment mark.

In some embodiments of the present disclosure, as shown in FIG. 1D, before placing the support plate carrying thereon the shielding member into the evaporation chamber (i.e., Step 1110), the method further includes Step 1111. In Step 1111, the shielding member is stretched, placed at a predetermined position on the support surface of the support plate through the alignment mark, and attached onto the support surface by a force generated by the electromagnet arranged at a side of the support plate away from the support surface.

In some embodiments of the present disclosure, as shown in FIG. 1E, before placing the support plate carrying thereon the shielding member into the evaporation chamber (i.e., Step 1110), the method further includes Step 1112. In Step 1112, the shielding member is stretched, placed at a predetermined position on the support surface of the support plate through the alignment mark, and attached onto the support surface by a force generated by the vacuum chuck on the support surface.

In some embodiments of the present disclosure, before attracting the shielding member onto the first surface of the to-be-evaporated substrate (i.e., Step 1120), the method further includes cancelling a force applied to the shielding member and enabling the shielding member being attached onto the first surface of the to-be-evaporated substrate, which departs the shielding member from the support plate.

In some embodiments of the present disclosure, as shown in FIG. 1D, subsequent to enabling the shielding member to be in contact with the to-be-cut region on the first surface of the to-be-evaporated substrate (i.e., Step 1110) and prior to enabling the electromagnet at the side of the second surface of the to-be-evaporated substrate to attract the shielding member onto the first surface (i.e., Step 1120), the method further includes Step 1113 including de-energizing the electromagnet at a side of the support plate away from the support surface, in which the force generated by the electromagnet at the side of the support plate away from the support surface to attach the shielding member onto the support plate disappears, and the shielding member departs from the support plate.

In some embodiments of the present disclosure, as shown in FIG. 1E, subsequent to enabling the shielding member to be in contact with the to-be-cut region at the first surface of the to-be-evaporated substrate (i.e., Step 1110) and prior to enabling the first electromagnet at the side of the second surface of the to-be-evaporated substrate to attract the shielding member onto the first surface (i.e., Step 1120), the method further includes Step 1114. In Step 1114, the vacuum chuck on the support surface is disenabled, in which a force enabling the shielding member to be attached onto the support plate disappears, and the shielding member departs from the support plate.

In some embodiments of the present disclosure, as shown in FIG. 1C, subsequent to the formation of the common layer of the display substrate, the method further includes Step 140 and Step 150. In step 140, the metal mask plate is moved out of the evaporation chamber. In Step 150, the shielding member is moved out of the evaporation chamber.

Usually, the shielding member is of a relatively small thickness and easily folded, the support plate in some embodiments is adopted to move the shielding member out of the evaporation chamber. In some embodiments of the present disclosure, as shown in FIG. 1D, the moving the shielding member out of the evaporation chamber (i.e., Step 150) includes Step 151, Step 152, Step 1531 and Step 154. In some embodiments, as shown in FIG. 1E, Step 150 includes Step 151, Step 152, Step 1532 and Step 154.

In Step 151, the support plate is moved into the evaporation chamber to enable the support surface of the support plate is in contact with the shielding member.

In Step 152, the electromagnet at the side of the second surface of the to-be-evaporated substrate is de-energized, to make the force attaching the electromagnet to the shielding member didapper.

In Step 1531, the electromagnet at a side of the support plate away from the support surface is energized, to generate a force which enables the shielding member being attracted onto the support plate.

In Step 1532, the vacuum chuck on the support surface is enabling, to generate a force which attracts the shielding member onto the support plate.

In Step 154, the support plate carrying thereon the shielding member is moved out of the evaporation chamber.

When the shielding member has a relatively large thickness, the evaporation of the common layer material and the arrangement of the metal mask plate may be adversely affected.

In some embodiments of the present disclosure, the shielding member has a thickness not greater than that of the metal mask plate.

Figure 1F:
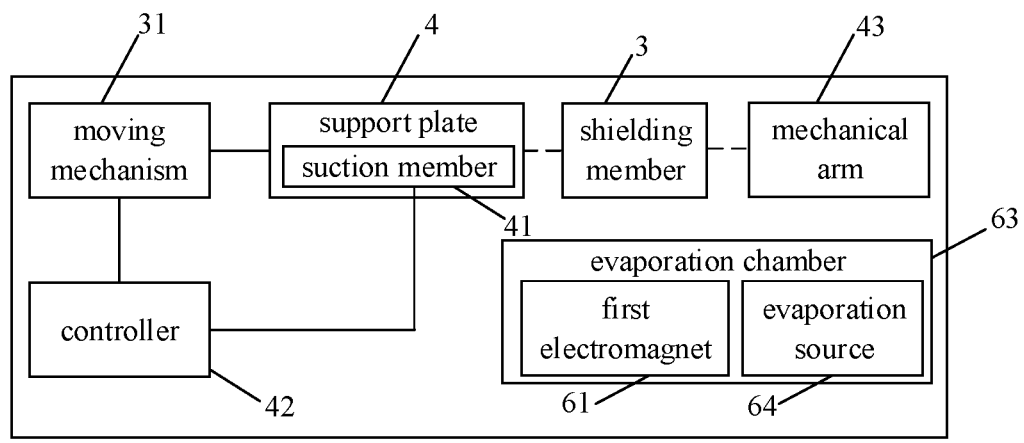
FIG. 1F is a schematic view showing a device for manufacturing a display substrate according to some embodiments of the present disclosure.

The present disclosure further provides in some embodiments a device for manufacturing a display substrate using the above-mentioned method. The device, as shown in FIG. 1F, includes a shielding member 3, a moving mechanism 31 and an evaporation source 64.

The evaporation source 64 is configured to evaporate a common layer material for forming a common layer of the display substrate onto a to-be-evaporated substrate 7. The moving mechanism 31 is configured to move the shielding member 3, in which the shielding member shields a to-be-cut region 2 when the common layer material is evaporated by the evaporation source 64 onto the to-be-evaporated substrate 7.

According to the embodiments of the present disclosure, when the common layer material is evaporated onto the to-be-evaporated substrate to form the common layer, the to-be-cut region of the display substrate is shielded with the shielding member, the common layer thereby does not cover the to-be-cut region. When the to-be-cut region is cut, it is able to prevent the common layer from being in contact with an external environment, and prevent the moisture and oxygen from entering the display substrate, thereby to prevent the service life of a display device from being adversely affected.

In some embodiments of the present disclosure, the moving mechanism 31 is a mechanical arm.

In some embodiments of the present disclosure, the shielding member is a magnetic member, and the device further includes a support plate 4 and a controller 42. The support plate 4 is connected to the moving mechanism 31 and configured to carry thereon the shielding member 3. The support member 4 includes a suction member 41. The controller 42 is electrically connected to the suction member 41, and configured to control the suction member 41 to enable the shielding member 3 being attached onto the support plate 4.

In some embodiments of the present disclosure, the shielding member 3 is made of a magnetic material, and the device further includes a first electromagnet 61 and an evaporation chamber 63. The first electromagnet 61 is arranged within the evaporation chamber 63 at a side of the to-be-evaporated substrate away from the evaporation source 64 (i.e., arranged at a side of the to-be-evaporated substrate away from the to-be-cut region), and configured to attract the shielding member 3 onto the to-be-evaporated substrate 7.

Through the first electromagnet 61 at the side of the to-be-evaporated substrate 7 away from the evaporation source, it is able to attach the shielding member 3 onto the to-be-cut region 2 before the evaporating a common layer material onto the to-be-evaporated substrate 7.

In some embodiments of the present disclosure, the suction member 41 is a vacuum chuck arranged on a support surface of the support plate 4 (i.e., a surface of the support plate 4 where the shielding member 3 is carried). The controller 42 is configured to enable or disenable the vacuum chuck.

When the vacuum chuck is enabled under the control of the controller 42, a force is generated by the vacuum chuck and applied to an object on a surface of the vacuum chuck. When the vacuum chuck is disenabled under the control of the controller 42, the force applied to the object on the surface of the vacuum chuck disappears, leading the object on the surface of the vacuum chuck departing from the vacuum chuck.

In some embodiments of the present disclosure, the suction member is a second electromagnet 62 arranged at a side of the support plate away from the support surface. The controller 42 is configured to energize or de-energize the second electromagnet 62.

When the second electromagnet 62 is energized under the control of the controller 42, a magnetic force is generated by the second electromagnet 62 and applied to a magnetic object made from a ferromagnetic or ferrimagnetic material such as iron. When the second electromagnet 62 is de-energized under the control of the controller 42, the magnetic force applied to the magnetic object on the support surface disappears.

Usually, the shielding member is of a relatively small thickness and easily folded, so the shielding member 3 in some embodiments is attached onto the support plate 3 through a force generated by the vacuum chuck or the second electromagnet 62, and then moved into or out of the evaporation chamber through the support plate 4.

In some embodiments of the present disclosure, as shown in FIG. 1F, the device further includes a mechanical arm 43 configured to stretch the shielding member 3, and place the shielding member 3 at a predetermined position on the support surface of the support plate 4 through an alignment mark on the support plate 4.

The method for manufacturing the display substrate will be described hereinafter in more details in conjunction with the drawings and embodiments.

In some embodiments of the present disclosure, the method includes the following steps.

Figure 2:
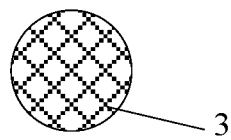
FIG. 2 is a schematic view showing a shielding member according to some embodiments of the present disclosure.

In Step 1, a magnetic material is selected to form a circular metal sheet having a radius R of 25 mm. Then, the circular metal sheet is cleaned and dried, acquiring the shielding member 3, as shown in FIG. 2. The shielding member 3 has a thickness smaller than or equal to a thickness of the metal mask plate for forming the common layer. For example, the magnetic material is INVAR.

Figure 3:
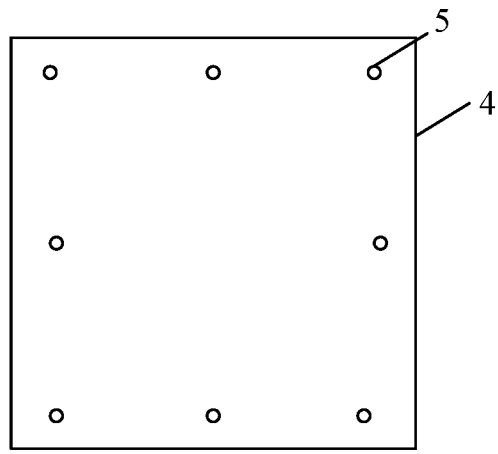
FIG. 3 is a schematic view showing a support plate according to some embodiments of the present disclosure.

In Step 2, the support plate 4 is formed and configured to carry thereon the shielding member 3. The support plate 4 is of the same size as the to-be-evaporated substrate. As shown in FIG. 3, the support plate 4 is provided with a plurality of alignment marks 5, e.g., alignment holes. When the shielding member 3 is placed onto the support plate 4, the shielding member 3 is aligned with the to-be-cut region through the alignment marks 5. In some embodiments, the support plate 4 is made of glass, an organic material, or austenitic stainless steel.

Figure 4:
FIG. 4 is a schematic view showing the support plate according to some other embodiments of the present disclosure.

As shown in FIG. 4, the second electromagnet 62 whose magnetism is controlled through a switch is arranged at a surface of the support plate 4 away from the support surface where the shielding member 3 is placed. The shielding member 3 is made of a magnetic material, so the second electromagnet 62 is energized to attract the shielding member 3 on the support plate 4. In some embodiments of the present disclosure, the vacuum chuck, which is controlled through a switch, is also be arranged at a surface of the support plate 4 in contact with the shielding member 3, and the shielding member 3 is attached onto the support plate through the vacuum chuck.

Figure 5:
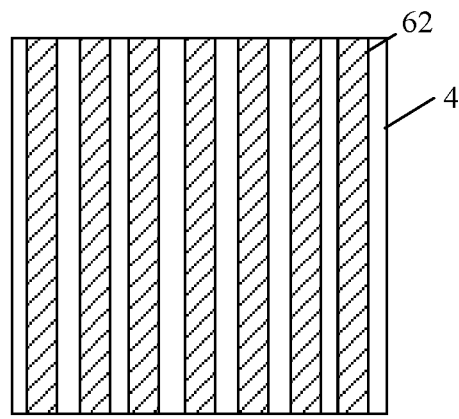
FIG. 5 is a schematic view showing the support plate according to some other embodiments of the present disclosure.

As shown in FIGS. 4 and 5, a plurality of second electromagnets 62 is arranged at intervals on the surface of the support plate 4. The more the second electromagnets 62, the larger the magnetic force applied to the shielding member 3.

In Step 3, the shielding member 3 is placed accurately at the predetermined position of the support plate 4 through the mechanical arm 43. In some embodiments, the shielding member 3 is aligned with the to-be-cut region through a charge-coupled device (CCD), and then placed at the predetermined position of the support plate 4.

Figure 6:
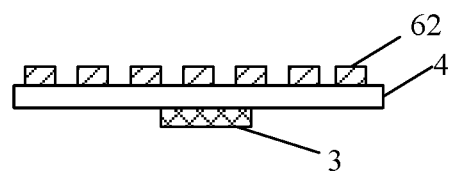
FIG. 6 is a schematic view showing a situation where a shielding member is attached onto a support plate according to some embodiments of the present disclosure.
Figure 7:
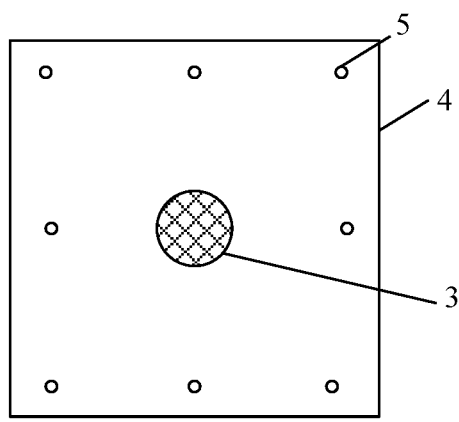
FIG. 7 is a schematic view showing the situation where the shielding member is attached onto the support plate according to some other embodiments of the present disclosure.

The shielding member 3 is of a relatively small thickness and easily folded, so an appropriate force is applied to the shielding member 3 to stretch the shielding member 3, and then the switch is turned on to energize the second electromagnet 62 on the surface of the support plate 4 to attach the shielding member 3 at the predetermined position of the support plate 4, as shown in FIGS. 6 and 7.

In some embodiments of the present disclosure, the switch is turned on to enable the vacuum chuck on the support plate 4, thereby to attach the shielding member 3 at the predetermined position of the support plate through a force generated by the vacuum chuck.

In Step 4, the support plate 4 carrying thereon the shielding member 3 is moved into the evaporation chamber.

Figure 8:
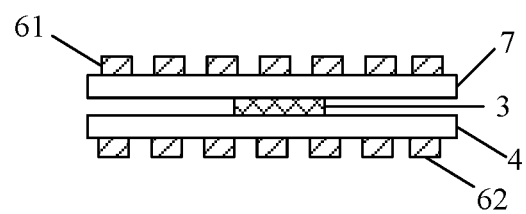
FIG. 8 is a schematic view showing a situation where the shielding member is in contact with a to-be-cut region according to some embodiments of the present disclosure.
Figure 9:
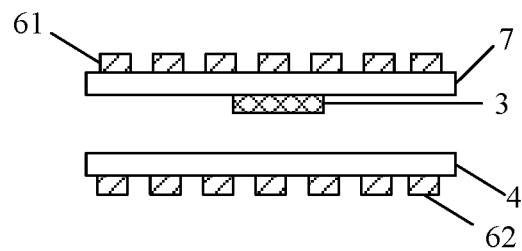
FIG. 9 is a schematic view showing a situation where the support plate is moved away according to some embodiments of the present disclosure.

After the to-be-evaporated substrate 7 has been placed into the evaporation chamber, the support plate 4 is aligned with the to-be-evaporated substrate 7 through a CCD. After the aligning the support plate 4 with the to-be-evaporated substrate 7, the support plate 4 or the to-be-evaporated substrate 7 is moved to enable the shielding member 3 to be attached to the to-be-cut region of the to-be-evaporated substrate 7. As shown in FIG. 8, the first electromagnet 61 is arranged at a side of the to-be-evaporated substrate 7 away from the shielding member 3. A switch for controlling the second electromagnet 62 at the side of the support plate 4 (or a switch controlling the vacuum chuck on the support plate 4) is turned off, a switch for controlling the first electromagnet 61 is turned on to attract the shielding member 3 onto the to-be-cut region of the to-be-evaporated substrate 7 by a force generated by the first electromagnet 61, and the support plate 4 is moved out of the evaporation chamber, as shown in FIG. 9.

In Step 5, the metal mask plate 8 for the formation of the common layer is moved into the evaporation chamber.

During evaporating a common layer material onto the to-be-evaporated substrate 7, an edge of the to-be-evaporated substrate is shielded by the metal mask plate. The metal mask plate covers the to-be-evaporated substrate, and made of austenitic stainless steel.

Figure 10:
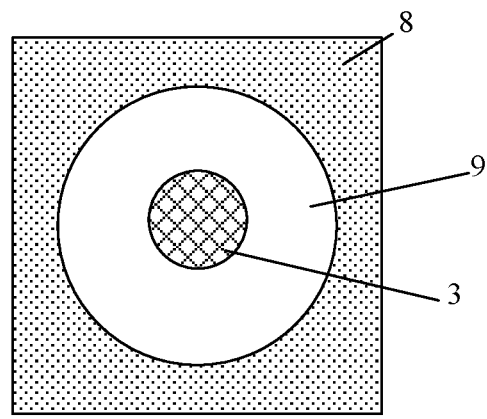
FIG. 10 is a schematic view showing an evaporation process of the to-be-evaporated substrate according to some embodiments of the present disclosure.
Figure 11:
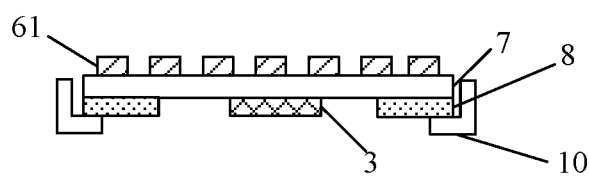
FIG. 11 is a schematic view showing the evaporation process of the to-be-evaporated substrate according to some other embodiments of the present disclosure.

After the support plate 4 has been moved out of the evaporation chamber, the metal mask plate 8 is moved into the evaporation chamber through the mechanical arm, and aligned with the to-be-evaporated substrate 7 through a CCD. After the alignment, the metal mask plate 8 is attached onto, and fixed through a fixation bracket 10 to, the to-be-evaporated substrate 7, as shown in FIGS. 10 and 11. A display region 9 of the display substrate surrounds the to-be-cut region to which the shielding member 3 is attached.

In Step 6, an organic material or a metallic material is evaporated within the evaporation chamber.

In Step 7, after the evaporation of the organic material or metallic material, the metal mask plate 8 is moved out of the evaporation chamber through the mechanical arm.

In Step 8, after the metal mask plate 8 is moved out of the evaporation chamber, the support plate 4 is moved into the evaporation chamber through the mechanical arm, aligned with the shielding member 3 through, e.g., the CCD, and then attached to the to-be-evaporated substrate 7. The first electromagnet 61 at the side of the to-be-evaporated substrate 7 away from a surface attaching to the shielding member is de-energized, and the switch for controlling the second electromagnet 62 at a side of the support plate 4 away from the support surface (or turning on a switch for controlling the vacuum chuck on the support plate 4), to attach the shielding member 3 at the predetermined position of the support plate 4. Then, the support plate 4 carrying thereon the shielding member 3 is moved out of the evaporation chamber.

A next to-be-evaporated substrate is moved into the evaporation chamber, and the above Steps 4-8 are repeated.

After the evaporating the to-be-evaporated substrate 7, it is able to acquire the display substrate with the common layer. The display substrate is provided in the middle with a circular region having a radius R of 25 mm and not covered by the common layer.

In the above embodiments of the present disclosure, two mask plates, i.e., the shielding member (for shielding the region of the to-be-evaporated substrate which does not need to be evaporated), and the metal mask plate (for shielding the edge of the to-be-evaporated substrate), are adopted. During the evaporations, the two mask plates are moved into the evaporation chamber sequentially, and after the evaporations, they are moved out of the evaporation chamber sequentially.

According to the method in the embodiments of the present disclosure, it is able to provide the display substrate with one or more to-be-cut regions not covered by the common layer. The to-be-cut region is encapsulated and cut (e.g., after the display substrate is manufactured and encapsulated), the encapsulation layer rather than a for-display layer is formed at the to-be-cut region. When the display substrate is cut at the to-be-cut region, due to the absence of any common layer at a cutting position, the common layer is not in contact with an external environment due to the encapsulation layer covering the common layer after the cutting. As a result, it is able to encapsulate inner and outer bezels of the display device with the encapsulation layer, and prevent the moisture and oxygen from entering the display device through the inner and outer bezels, thereby to ensure the service life of the display device.

In some other embodiments of the present disclosure, the method includes the following steps.

Figure 12:
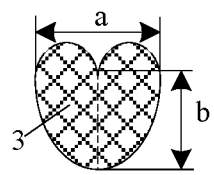
FIG. 12 is a schematic view showing the shielding member according to some other embodiments of the present disclosure.

In Step 11, a magnetic material is selected to form a heart-shaped metal sheet which has a longest horizontal side with a length a of 20 mm and a longitudinal central line with a length b of 20 mm. Then, the heart-shaped metal sheet is cleaned and dried, to acquire the shielding member 3, as shown in FIG. 12. The shielding member 3 has a thickness smaller than or equal to the metal mask plate for forming the common layer. For example, the magnetic material is INVAR.

In Step 12, the support plate 4 is formed and configured to carry thereon the shielding member 3. The support plate 4 is of the same size as the to-be-evaporated substrate. As shown in FIG. 3, the support plate 4 is provided with a plurality of alignment marks 5, e.g., alignment holes. When the shielding member 3 is placed onto the support plate 4, the shielding member 3 is aligned with the to-be-cut region through the alignment marks 5. The support plate 4 is made of glass, an organic material, or austenitic stainless steel.

As shown in FIG. 4, the second electromagnet 62 whose magnetism is controlled through a switch is arranged at a surface of the support plate 4 away from the support surface where the shielding member 3 is placed. The shielding member 3 is made of the magnetic material, so the second electromagnet 62 is energized to attract the shielding member 3 onto the support plate 4. In some embodiments of the present disclosure, the vacuum chuck, which is controlled through a switch, is arranged at a surface of the support plate 4 in contact with the shielding member 3, and the shielding member 3 is attached onto the support plate through a force generated by the vacuum chuck.

As shown in FIGS. 4 and 5, a plurality of second electromagnets 62 is arranged at intervals at the surface of the support plate 4. The more the second electromagnets 62, the larger the force applied to the shielding member 3.

In Step 13, the shielding member 3 is placed accurately at the predetermined position of the support plate 4 through the mechanical arm 43. For example, the shielding member 3 is placed at the predetermined position of the support plate 4 through the CCD.

The shielding member 3 is of a relatively small thickness and easily folded, so an appropriate force is applied to the shielding member 3 to stretch the shielding member 3, and then the switch is turned on to energize the second electromagnet 62 at the surface of the support plate 4, to attach the shielding member 3 at the predetermined position of the support plate 4, as shown in FIG. 6. In some embodiments of the present disclosure, the switch is turned on to enable the vacuum chuck on the support plate 4, thereby to attach the shielding member 3 at the predetermined position of the support plate through a force generated by the vacuum chuck.

In Step 14, the support plate 4 carrying thereon the shielding member 3 is moved into the evaporation chamber.

After the to-be-evaporated substrate 7 is placed into the evaporation chamber, the support plate 4 carrying thereon the shielding member 3 is moved into the evaporation chamber through the mechanical arm. The shielding member 3 is aligned with the to-be-cut region of the to-be-evaporated substrate 7 through the CCD. After the alignment, the to-be-plated substrate 7 or the support plate 4 is moved in such a manner as to enable the shielding member 3 to be attached to the to-be-cut region of the to-be-plated substrate 7. As shown in FIG. 8, the first electromagnet 61 is arranged at a side of the to-be-evaporated substrate 7 away from the shielding member 3. A switch for controlling the second electromagnet 62 at the side of the support plate 4 (or a switch for controlling the vacuum chuck on the support plate 4) is turned off, a switch for controlling the first electromagnet 62 is turned on to attract the shielding member 3 onto the to-be-cut region of the to-be-evaporated substrate 7, and then the support plate 4 is moved out of the evaporation chamber, as shown in FIG. 9.

In Step 15, the metal mask plate 8 for the formation of the common layer is moved into the evaporation chamber.

During evaporating a common layer material onto the to-be-evaporated substrate 7, an edge of the to-be-evaporated substrate is shielded by the metal mask plate. The metal mask plate covers the to-be-evaporated substrate, and made of austenitic stainless steel.

After the support plate 4 is moved out of the evaporation chamber, the metal mask plate 8 is moved into the evaporation chamber through the mechanical arm, and aligned with the to-be-evaporated substrate 7 through the CCD. After the alignment, the metal mask plate 8 is attached onto, and fixed through a fixation bracket 10 to, the to-be-evaporated substrate 7, as shown in FIG. 11. The display region 9 of the display substrate surrounds the to-be-cut region to which the shielding member 3 is attached.

In Step 16, an organic material or a metallic material is evaporated within the evaporation chamber.

In Step 17, after the evaporation of the organic material or metallic material, the metal mask plate 8 is moved out of the evaporation chamber through the mechanical arm.

In Step 18, after the metal mask plate 8 is moved out of the evaporation chamber, the support plate 4 is moved into the evaporation chamber through the mechanical arm, aligned with the shielding member 3 through, e.g., the CCD, and then attached to the to-be-evaporated substrate 7. The first electromagnet 61 at the side of the to-be-evaporated substrate 7 away from the support surface where the shielding member is placed is de-energized, and the switch for controlling the second electromagnet 62 at the surface of the support plate 4 away from the shielding member (or for controlling the vacuum chuck on the support plate 4), to attach the shielding member 3 at the predetermined position of the support plate 4. Then, the support plate 4 carrying thereon the shielding member 3 is moved out of the evaporation chamber.

A next to-be-evaporated substrate is moved into the evaporation chamber, and the above Steps 14-18 is repeated.

After the evaporation, it is able to acquire the display substrate with the common layer. The display substrate is provided in the middle with a heart-shaped region which has the longest horizontal side with the length a of 20 mm and the longitudinal center line with the length b of 20 mm and which is not covered by the common layer.

In the above embodiments of the present disclosure, two mask plates, i.e., the shielding member (for shielding the region of the to-be-evaporated substrate which does not need to be evaporated), and the metal mask plate (for shielding the edge of the to-be-evaporated substrate), are be adopted. During the evaporation, the two mask plates are moved into the evaporation chamber sequentially, and after the evaporation, they are moved out of the evaporation chamber sequentially.

According to the method in the embodiments of the present disclosure, it is able to provide the display substrate with one or more to-be-cut regions not covered by the common layer. After the to-be-cut region is encapsulated and cut (e.g., after the display substrate is manufactured and encapsulated), the encapsulation layer rather than the for-display layer is formed at the to-be-cut region. When the display substrate is cut at the to-be-cut region, due to the absence of any common layer at a cutting position, the common layer is not in contact with an external environment due to the encapsulation layer covering the common layer after the cutting. As a result, it is able to encapsulate inner and outer bezels of the display device with the encapsulation layer, and prevent the moisture and oxygen from entering the display device through the inner and outer bezels, thereby to ensure the service life of the display device.

The present disclosure further provides in some embodiments a display substrate manufactured according to the above-mentioned method. The to-be-cut region of the display substrate is not covered by the common layer.

The present disclosure further provides in some embodiments a display device including the above-mentioned display substrate. The display device may be any product or member having a display function, e.g., television, display, digital photo frame, mobile phone or flat-panel computer. In some embodiments of the present disclosure, the display device further includes a flexible circuit board, a printed circuit board and a back plate.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "connect/connected to" or "couple/coupled to" may include electrical connection, direct or indirect, rather than to be limited to physical or mechanical connection.

What is claimed is:

1. A device for manufacturing a display substrate, comprising:
    an evaporation source, configured to evaporate a common layer material for forming a common layer of the display substrate onto a to-be-evaporated substrate;
    a shielding member, configured to shield a to-be-cut region of the to-be-evaporated substrate;
    a metal mask plate, configured to form the common layer;
    an evaporation chamber; and
    a moving mechanism, configured to move the shielding member into the evaporation chamber to shield the to-be-cut region when the common layer material is evaporated by the evaporation source onto the to-be-evaporated substrate;
    wherein the shielding member and the metal mask plate are made of different materials;
    wherein the shielding member is made of INVAR and the metal mask plate is made of austenitic stainless steel.

2. The device according to claim 1, further comprising a support plate and a controller;
    wherein the shielding member is a magnetic member, the support plate is connected to the moving mechanism and configured to carry the shielding member; the support member comprises a suction member; and the controller is electrically connected to the suction member, and configured to control the suction member to attach the shielding member onto the support plate.

3. The device according to claim 2, further comprising a first electromagnet, wherein the first electromagnet is arranged within the evaporation chamber at a side of the to-be-evaporated substrate away from the evaporation source, and configured to attract the shielding member onto the to-be-evaporated substrate.

4. The device according to claim 3, wherein the suction member is a second electromagnet arranged at a side of the support plate away from a support surface which is a surface of the support plate where the shielding member is placed.

5. The device according to claim 3, wherein the suction member is a vacuum chuck arranged on a support surface of the support plate, and the support surface is a surface of the support plate where the shielding member is placed.

* * * * *